(12) United States Patent
Nozute

(10) Patent No.: US 7,745,842 B2
(45) Date of Patent: Jun. 29, 2010

(54) GRAYTONE MASK AND METHOD THEREOF

(75) Inventor: Shigenori Nozute, Kumamoto (JP)

(73) Assignee: Hoya Corporation (JP)

( * ) Notice: Subject to any disclaimer, the term of this patent is extended or adjusted under 35 U.S.C. 154(b) by 0 days.

(21) Appl. No.: 10/170,229

(22) Filed: Jun. 13, 2002

(65) Prior Publication Data

US 2004/0161674 A1 Aug. 19, 2004

(51) Int. Cl.
*H01L 33/00* (2010.01)

(52) U.S. Cl. .............. 257/98; 257/E21.023; 438/942; 430/5

(58) Field of Classification Search ............. 257/88, 257/98, E21.023, E21.025, E21.034, 79; 438/29, 66, 942, 948, 950–952; 349/49, 349/42, 110, 113; 430/5
See application file for complete search history.

(56) References Cited

U.S. PATENT DOCUMENTS

| | | | | |
|---|---|---|---|---|
| 5,510,915 A * | 4/1996 | Ge et al. | ....................... | 349/42 |
| 5,808,714 A * | 9/1998 | Rowlands et al. | ........... | 349/110 |
| 6,310,670 B1 * | 10/2001 | Lee | .............. | 349/43 |
| 6,338,989 B1 * | 1/2002 | Ahn et al. | ................... | 438/158 |
| 6,362,032 B1 * | 3/2002 | Kim et al. | ................... | 438/158 |
| 6,557,174 B2 * | 5/2003 | Martin et al. | ...................... | 2/8 |
| 6,600,467 B1 * | 7/2003 | Webb | .......................... | 345/87 |
| 6,660,649 B2 * | 12/2003 | Dao et al. | .................... | 438/717 |
| 6,686,229 B2 * | 2/2004 | Deane et al. | ................ | 438/151 |
| 6,734,930 B2 * | 5/2004 | Yu et al. | ....................... | 349/69 |
| 6,773,941 B2 * | 8/2004 | French et al. | ................. | 438/29 |
| 6,781,653 B2 * | 8/2004 | Park et al. | ................... | 349/113 |

FOREIGN PATENT DOCUMENTS

| | | | |
|---|---|---|---|
| JP | 7-49410 | | 2/1995 |
| JP | 07-049410 | * | 2/1995 |
| JP | 2002-131885 A | | 5/2002 |

OTHER PUBLICATIONS

Technical Report of FPD Intelligence 1999.

* cited by examiner

*Primary Examiner*—Hoa B Trinh
(74) *Attorney, Agent, or Firm*—Sughrue Mion, PLLC

(57) ABSTRACT

A transmissivity controlled film 12 (CrO or the like), a transmissivity reduced film 13 (Cr or the like), and a resist film 14, for instance, are sequentially formed on, e.g., a transparent substrate 11. A resist is removed from an area (an area C) where a light-transmission section is to be formed, and the transmissivity reduced film 13 and the transmissivity controlled film 12 are removed from the area, thereby forming a light-transmission section. Next, a resist is removed from an area (an area A) in which a graytone section is to be formed, thereby removing the transmissivity reduced film 13 from that area, to thereby form a graytone section. Thus, a graytone mask is manufactured.

37 Claims, 7 Drawing Sheets

PRIOR ART
FIG. 6A
PRIOR ART
FIG. 6B
PRIOR ART
FIG. 6C
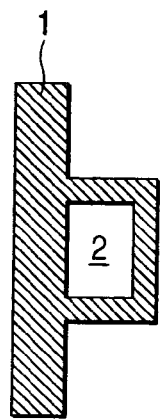
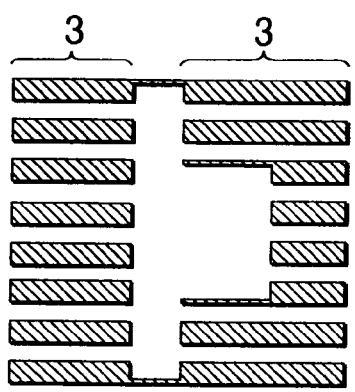
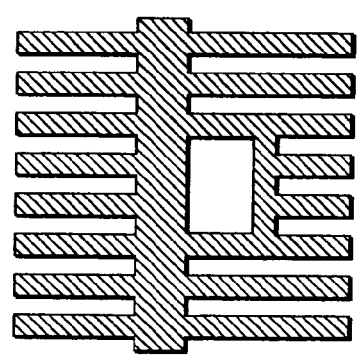

GRAYTONE MASK AND METHOD THEREOF

BACKGROUND OF THE INVENTION

1. Field of the Invention

The invention relates to a graytone mask and a manufacturing method thereof.

2. Description of the Related Art

In recent years, attempts have been made to reduce the number of mask sheets by using graytone masks in the field of large-sized LCD masks (as set forth in the monthly FPD Intelligence, May, 1999).

As shown in FIG. 5A, such a graytone mask has an opaque part 1, a transmission part 2 and a graytone part 3. The graytone part 3 corresponds to an area in which there is formed an opaque pattern 3a of below or equal to the resolution limit of an exposure apparatus for a large-sized LCD using the graytone mask and is designed to selectively change the thickness of a photoresist film by decreasing the light transmitted through this area so as to decrease the amount of irradiation due to the area. Normally, the opaque part 1 and the opaque pattern 3a are formed with films that are made of the same material such as chromium (Cr) or a chromium compound and have the same thickness.

The resolution limit of the exposure apparatus for the large-sized LCD using the graytone mask is about 3 μm in the case of an exposure apparatus of a stepper type and about 4 μm in the case of an exposure apparatus of a mirror projection type. Consequently, the space width of a transmission part 3b in the graytone part of FIG. 5A is set at less than 3 μm and the line width of the opaque pattern 3a of below or equal to the resolution limit of the exposure apparatus is set at less than 3 μm, for example. When the exposure apparatus for the large-sized LCD is used for light exposure, as the exposure light transmitted through the graytone part 3 as a whole is deficient in the amount of light exposure, positive photoresists are left on a substrate though the thickness of the positive photoresists exposed to light via the graytone part 3 solely decreases. More specifically, there arises a difference in solubility of resists in developing liquid between parts corresponding to the ordinary opaque part 1 and to the graytone part because of difference in the amount of light exposure and this results in, as shown in FIG. 5B, making a part 1' corresponding to the ordinary opaque part 1 as thick as about 1.3 μm, making a part 3' corresponding to the graytone part 3 as thick as about 0.3 μm and making a part corresponding to the transmission part 2 a part 2' without resists, for example. A first etching of a substrate as a workpiece is carried out in the part 2' without the resists so as to remove the resists in the thin part 3' corresponding to the graytone part 3 by ashing and the like and by carrying out a second etching of this part, the etching process is performed with one mask instead of two masks as conventionally used in order to reduce the number of masks for use.

In order to form a graytone section in the graytone mask in the form of a fine pattern having a size equal to the resolution limit of a large LCD aligner using a graytone mask, a minute line-and-space pattern is ideally given a pitch of ±2 μm or thereabouts (about one-half this pitch; that is, 1 μm or thereabouts, becomes a fine light transmission section). A fine pattern must be processed with an accuracy of ±0.2 μm or thereabouts. However, in terms of the accuracy achieved by the current large mask for use in manufacturing an LCD, this represents very rigorous accuracy.

A current large mask automatic imperfection inspection system encounters great difficulty in finding an imperfection at a pitch pattern of 2 μm (particularly, an imperfection in the edge of a pattern). Further, great difficulty is encountered also in carrying out inspection of a fine pattern with an accuracy of ±0.2 μm or thereabouts. Further, since the graytone section is formed from a fine pattern, the volume of data required to be prepared becomes enormous. When the volume of data has exceeded the capacity of an aligner or a data converter (or format converter) associated with the aligner, aligning may become impossible. Specifically, data pertaining to the graytone sections 3 shown in, e.g., FIG. 6B, must be prepared so as to avoid an opaque section and a light transmission section for preventing occurrence of an overlap between the opaque section 1 and the light transmission section 2 shown in FIG. 6A. As a result, preparation of data becomes complicated. In addition, data pertaining to the graytone sections 3 show complicated geometries defined along the opaque section and the light transmission section. Hence, the volume of data pertaining to the graytone sections becomes enormous, and hence the volume of data pertaining to merged data shown in FIG. 6C also becomes enormous.

In a certain known graytone mask, the thickness of a chromium single layer film laid on a transparent substrate is changed locally. In the mask, an area having a large thickness is taken as an opaque section; an area having an intermediate thickness is taken as a graytone section; and an area having no thickness is taken as a light transmission section. However, a chromium film has low transmissivity (i.e., a high opaque characteristic), and hence a small thickness enables achievement of 0% transmissivity. For this reason, difficulty is encountered in half-etching the chromium single layer film so as to achieve a predetermined intermediate transmissivity in the area having an intermediate thickness. Therefore, there has been proposed a graytone mask in which the thickness of a chromium compound single layer film laid on a transparent substrate is partially changed (as described in Japanese Patent Application Laid-Open No. 49410/1995). In this case, since an area of the chromium compound single layer film where a 0% transmissivity is achieved assumes a thickness as large as about 4000 angstroms, half-etching of the film such that a predetermined intermediate transmissivity is achieved in an area having an intermediate thickness becomes easier than in the case of the chromium single layer film. However, since the thickness is excessive, an aspect ratio (i.e., a ratio of a pattern size to a height) becomes high, consequently deteriorating the pattern geometry and accuracy of an opaque section and resulting in a longer etching time. In fact, rigorous control of a thickness during half-etching operation entails difficulty. Thus, thickness control involves practical difficulty.

SUMMARY OF THE INVENTION

The object of the invention is to provide a graytone mask and a method of manufacturing the same, which solve the problems set forth.

The invention adopts the following configurations:

(Configuration 1) A graytone mask having an opaque section, a light transmission section, and a graytone section which permits transmission of a portion of exposing radiation, the mask being characterized in that films constituting the opaque section comprises, from a transparent substrate side, a transmissivity controlled film for primarily controlling the transmissivity of a graytone section and a transmissivity reduced film for reducing the transmissivity of the opaque section;

the transmissivity controlled film and the transmissivity reduced film are formed from films containing the same species of metal; and, in the graytone section, the films constituting the opaque section is partially removed in a thickness-wise direction thereof.

(Configuration 2) The graytone mask of Configuration 1 is further characterized in that the transmissivity controlled film is formed from material whose etching rate is equal to or slower than that of the transmissivity reduced film.

(Configuration 3) The graytone mask of Configuration 2 is further characterized in that the transmissivity controlled film is composed of a chromium compound, and the transmissivity reduced film is composed of chromium.

(Configuration 4) The graytone mask of any one of Configurations 1 through 3 is further characterized in that an anti-reflection film is provided on the transmissivity reduced film.

(Configuration 5) A method of manufacturing the graytone mask of any one of Configurations 1 through 4, the method being characterized by comprising the steps of:

preparing a mask blank, in which at least a transmissivity controlled film and a transmissivity reduced film are sequentially formed on a transparent substrate;

forming a resist film on the blank;

exposing light to the resist film such that an area of the film where a light transmission section is to be formed is exposed at an amount of exposing radiation at which resist is fully sensitized and such that an area of the film where a graytone section is to be formed is exposed at an amount of exposing radiation smaller than that at which resist is fully sensitized;

forming a resist pattern, through development processing, such that a resist film remaining in the area where an opaque section is to be formed differs in thickness from that remaining in the area where a graytone section is to be formed;

forming a light transmission section by means of etching a transmissivity reduced film and a transmissivity controlled film while the resist pattern is taken as a mask;

removing only the resist pattern remaining on the graytone section;

removing at least a portion of multilayered film formed from a transmissivity reduced film and a transmissivity controlled film while the resist pattern remaining in the preceding step is taken as a mask; and stripping a still remaining resist pattern.

(Configuration 6) A graytone mask blank for use in manufacturing the graytone mask of any one of Configurations 1 through 4, the mask being characterized by comprising:

at least a transmissivity controlled film for primarily controlling the transmissivity of a graytone section and a transmissivity reduced film for reducing the transmissivity of an opaque section, which are provided on a transparent substrate in this order and are formed from films containing the same species of metal; and an opaque film constituted of the transmissivity controlled film and the transmissivity reduced film.

(Configuration 7) A graytone mask having an opaque section, a light-transmission section, and a graytone section which permits transmission of a portion of exposing radiation, the mask being characterized in that the opaque section includes a semi-transparent film, an etch stopper film, and an opaque film, which are provided on a transparent substrate in this order; and the graytone section includes the semi-transparent film formed on the transparent substrate or the semi-transparent film and the etch stopper film.

(Configuration 8) The graytone mask of Configuration 7 is further characterized in that the opaque film and the semi-transparent film are formed from a film which can be processed through use of a single etchant or a single etching gas.

(Configuration 9) The graytone mask of Configuration 7 or 8 is further characterized in that the opaque film and the semi-transparent film are formed from material including chromium.

(Configuration 10) The graytone mask of any one of Configurations 7 through 9 is further characterized in that the etch stopper film is formed from $SiO_2$ or spin on glass (SOG).

(Configuration 11) A method for manufacturing the graytone mask of any one of Configurations 7 through 10, the method being characterized by comprising the steps of:

preparing a mask blank, in which at least a semi-transparent film, an etch stopper film, and an opaque film are sequentially formed on a transparent substrate;

forming a resist film on the blank;

exposing light to the resist film such that an area of the film where a light transmission section is to be formed is exposed at an amount of exposing radiation at which resist is fully sensitized and such that an area of the film where a graytone section is to be formed is exposed at an amount of exposing radiation smaller than that at which resist is fully sensitized;

forming a resist pattern, through development processing, such that a resist film remaining in the area where an opaque section is to be formed differs in thickness from that remaining in the area where a graytone section is to be formed;

forming a light transmission section by means of etching a semi-transparent film, an etch stopper film, and an opaque film while the resist pattern is taken as a mask;

removing only the resist pattern remaining on the graytone section;

removing the opaque film or the opaque film and etch stopper film while the resist pattern remaining in the preceding step is taken as a mask; and stripping a still remaining resist pattern.

(Configuration 12) A graytone mask blank for use in manufacturing the graytone mask of any one of Configurations 7 through 10, the blank being characterized by comprising:

a semi-transparent film, an etch stopper film, and an opaque film provided on a transparent substrate.

(Configuration 13) The graytone mask of any one of Configurations 1 through 4 and 7 through 10 is further characterized in that the graytone mask is an LCD mask or PDP mask.

According to Configuration 1, a film constituting an opaque section is constituted in the form of a two-layer structure; that is, a transmissivity controlled film and a transmissivity reduced film which is lower in optical transmissivity than the transmissivity controlled film. As a result, the opaque film can be made thicker than the transmissivity reducing single layer film (e.g., a conventional chromium single layer film) and thinner than the transmissivity control single film (e.g., a conventional chromium-compound single layer film). Therefore, the thickness of a graytone section can be controlled by means of half etching. Further, there can be made an attempt to shorten an etching time. Since a low aspect ratio is achieved, the geometry and accuracy of a pattern formed in the opaque section can be made better consequently.

In the graytone section, a multilayer film—consisting of a transmissivity reduced film constituting an opaque section and a transmissivity controlled film—is partially removed in the thickness direction thereof. The grayton section assumes various forms; e.g., a form in which the transmissivity reduced film is removed from the graytone section; another form in which the transmissivity reduced film is partially removed in the thickness direction thereof; and still another form in which the transmissivity controlled film as well as the transmissivity reduced film are partially removed in the thickness direction thereof.

According to Configuration 2, the transmissivity controlled film is formed from material whose etch rate is equal to or lower than that of the transmissivity reduced film. When the transmissivity reduced film is removed by means of etching, the risk of etching proceeding up to the transmissivity controlled film can be reduced. Consequently, there can be readily provided a graytone mask having high uniformity in the thickness of the transmissivity controlled film.

According to Configuration 2, the transmissivity controlled film is preferably formed from a thin metal layer desired to be used for controlling transmissivity (e.g., a chromium compound, MoSi, Si, W, Al), and the transmissivity reduced film is preferably formed from a thin film having a high opaque characteristic (e.g., chromium, Si, W, Al). Moreover, a combination of materials having superior mutual adhesion is preferable.

According to Configuration 3, the transmissivity controlled film is formed from a chromium compound (particularly chromium oxide). Hence, a transmissivity controlled film whose transmissivity is controlled and has a uniform thickness is easy to obtain. Further, a transmissivity reduced film can be formed to small thickness by means of forming the transmissivity reduced film from chromium.

The chromium compounds described in connection with Configurations 2 and 3 include chromium oxide ($CrO_x$), chromium nitride ($CrN_x$), chromium oxinitride ($CrO_xN_y$), chromium fluoride ($CrF_x$), and films which are made of these compounds and contain carbon or hydrogen.

According to Configuration 4, a graytone mask having an anti-reflection layer is obtained by use of a mask blank formed by placing the anti-reflection layer on a transmissivity reduced film and by means of etching the mask blank.

According to Configuration 5, the thickness of a resist varies from an area to another area in accordance with the amount of exposing radiation. Hence, resist processes [i.e., resist coating, lithography (exposure), and development] become unnecessary.

According to Configuration 6, use of the mask blank enables manufacture of a graytone mask by way of only a process for removing the respective film layers and a process for reducing the thickness of the resist. Further, there can be produced a high-quality graytone mask which is superior in the geometry and accuracy of a pattern formed in an opaque section and has a superior uniform transmission characteristic or such in the graytone section (semi-transparent section).

According to Configuration 7, there is employed a three-layer structure; that is, a semi-transparent film, an etch stopper film, and an opaque film, all being formed sequentially on a transparent substrate. There can be prevented occurrence of a reduction in the thickness of a semi-transparent film, which would otherwise be caused when an opaque film is removed from a graytone section (semi-transparent section) by means of etching. Consequently, there can be readily provided a graytone mask, wherein extremely high uniformity in the thickness of a semi-transparent film is achieved. Further, the opaque film can be formed from a film which is thin and has a high opaque characteristic, such as a chromium film. Therefore, an attempt can be made to shorten an etching time, and a low aspect ratio is achieved. Consequently, the geometry and accuracy of a pattern formed in the opaque section are improved. Moreover, since an etch stopper layer is provided, an opaque film and a semi-transparent film can be formed from films of the same species of material or films containing analogous main ingredients.

When $SiO_2$ or SOG (spin on glass) is used as a material of the etch stopper film, $SiO_2$ or SOG has the same transmission characteristic as that of the transparent substrate. Hence, even when the etch stopper film is provided in the graytone section (semi-transparent section), the film does not affect the transmission characteristic of the graytone section. Hence, there is no necessity of removing an etch stopper film in the graytone section (semi-transparent section).

In the invention, use of any one selected from the group comprising Cr, a chromium compound, MoSi, Si, W, and Al as an opaque film and/or a semi-transparent film is preferable.

According to Configuration 8, the opaque film and the semi-transparent film can be processed simultaneously by means of forming an opaque film and a semi-transparent film from films which can be processed by a single etchant or a single etching gas.

According to Configuration 9, an opaque film and a semi-transparent film are formed from a material including chromium. The opaque film and the semi-transparent film can be processed simultaneously through use of a single etchant or a single etching gas. As examples thereof, there are mentioned films of the same material (e.g., a semi-transparent film formed from Cr and an opaque film formed from Cr) and films containing analogous main ingredients (e.g., a semi-transparent film made of a chromium compound and an opaque film made of Cr). Particularly when a semi-transparent film is made of a chromium compound and a semi-transparent film is made of Cr, the following effects are yielded. First, when a semi-transparent film is made of a chromium compound, the thickness of the film which is made of a chromium compound and has a predetermined transmissivity can be increased. Hence, uniformity in the thickness of the film and uniformity in the transmissivity of the film can be controlled with high accuracy. In contrast, when the semi-transparent film is made of Cr, a film which has a predetermined transmissivity and is made of Cr is very thin. Even if a slight fluctuation has arisen in the thickness of the film, the transmissivity of the film will change greatly. Hence, highly accurate control of uniformity in the thickness of a Cr semi-transparent film and uniformity of transmissivity of the film is more difficult than in the case of a film made of a chromium compound. If an opaque film is made of Cr or the like, the thickness of a film which is made of Cr and has a predetermined opaque characteristic (optical density) can be made small. Consequently, the thickness of an overall opaque section can be suppressed, and hence the geometry and accuracy of a pattern formed in the opaque section are improved. In contrast, when the opaque film is made of a chromium compound, the thickness of a film which has a predetermined opaque characteristic (i.e., optical density) and is made of a chromium compound becomes larger. Consequently, the thickness of an overall opaque section cannot be suppressed. Hence, the geometry and accuracy of a pattern formed in the opaque section become inferior.

In relation to Configurations 7 through 9, chromium oxide ($CrO_x$), chromium nitride ($CrN_x$), chromium oxinitride ($CrO_xN_y$), chromium fluoride ($CrF_x$), and films which are made of these compounds and contain carbon or hydrogen can be used as the chromium compound.

According to Configuration 10, $SiO_2$ or SOG (spin on glass) is used as an etch stopper film. Since $SiO_2$ and SOG has the same transmission characteristic as that of the transparent substrate, no influence is imposed on the transmissivity characteristic of the opaque section or graytone section (semi-transparent section) even when $SiO_2$ or SOG is provided in the opaque section or the graytone section. Further, $SiO_2$ and SOG are preferable in that they act as an etch stopper layer against many types of materials for an opaque film or a semi-transparent film. Further, $SiO_2$ and SOG show high adhesion to material of an opaque film and that of a semi-transparent film.

When no etch stopper layer is provided, the semi-transparent film and the opaque film must be made of material which ensures an etch selectivity. Thus, a limitation is imposed on material of the semi-transparent film and that of the opaque film. Further, adhesion of the semi-transparent film to the opaque film may raise a problem.

The thickness of an etch stopper layer made of $SiO_2$ or SOG preferably ranges from 100 to 1000 angstroms.

According to Configuration 11, resist processes [e.g., resist coating, lithography (exposure), or development] required in a subsequent step become unnecessary, by means of causing the thickness of a resist to change in accordance with the amount of exposing radiation in individual regions.

Here, processing pertaining to a step of removing an etch stopper film from an area where a light transmission section is to be formed and processing pertaining to a step of removing a resist from an area where a semi-transparent section is to be formed are preferably performed simultaneously.

Processing pertaining to a step of removing a semi-transparent film from an area where a light transmission section is to be formed and processing pertaining to a step of removing an opaque film from an area where a semi-transparent section is to be formed are preferably performed simultaneously.

By means of the mask blank described in connection with Configuration 12, a graytone mask can be manufactured by way of only a step of removing films from layers and a step of reducing the thickness of resist. Further, there is obtained a high-quality graytone mask which has superior uniformity in the thickness of a graytone section (semi-transparent film) and superior uniformity in a transmission characteristic.

In relation to Configurations 7 through 12, the only requirement is that an optical density of 3.0 or more be achieved by way of a combination of an opaque film and a semi-transparent film. In short, even when the opaque film does not have an optical density of 3.0 or more, no problem will arise so long as an optical density of 3.0 or more is achieved by means of a combination of the opaque film and the semi-transparent film. In this case, the opaque film can be made thin by only an amount corresponding to the optical density of the semi-transparent film.

According to Configuration 13, in the case of a graytone mask blank for use in producing an LCD, a substrate is large, and hence difficulty is encountered in ensuring uniformity in the thickness of a film. According to a method of reducing a single layer film to an intermediate thickness by means of half-etching, the thickness of the film must be controlled strictly, by means of half-etching in consideration of variations in the thickness of the film formed on the mask blank (more specifically, planar variations in etching depth due to half-etching must be suppressed to substantially zero). In practice, such strict control of thickness is difficult. Therefore, such a method entails a practical problem. In contrast, the method of manufacturing a graytone mask according to the invention does not entail such a problem. Consequently, the invention is indispensable for commercializing a large graytone mask [such as a mask for use in producing a color filter or a thin-film transistor (TFT)] for use in producing an LCD (liquid crystal display device) or a large graytone mask for use in producing a PDP (plasma display panel).

The graytone mask and the manufacturing method therefor according to the invention yield the following effects.

A graytone section does not need to be formed from a fine pattern having a size of resolution limit of a large LCD aligner using a graytone mask. Hence, there is not raised a problem relating to the accuracy of machining of a fine pattern in a graytone section.

The graytone section is controlled by means of the thickness of a transmissivity controlled film, or the graytone (semi-transparent section) is controlled by means of the thickness of a semi-transparent film. As a result, a detected waveform becomes stable. Hence as compared with a case where a graytone section is formed from a fine pattern, imperfections are detected readily.

A transmissivity controlled film whose transmissivity has been controlled beforehand or a semi-transparent film whose transmissivity has been controlled is used. Hence, transmissivity control is easy.

Even when a pattern formed in the opaque section and that formed in the light transmission section assume complicated geometries, the patterns are uniformly transferred onto an overall graytone section by means of the graytone section (i.e., a semi-transparent section or semi-transmission section) regulating the amount of exposing radiation (i.e., through so-called solid exposure). Hence, the volume of lithography data required for the graytone becomes smaller than in the case where a graytone section made of a fine pattern is written through lithography, thereby facilitating lithography operation.

BRIEF DESCRIPTION OF THE DRAWINGS

FIGS. 1A through 1C are views for describing lithography data according to an embodiment of the invention, wherein FIG. 1A shows merged data obtained when all pattern data are integrated, FIG. 1B shows lithography data pertaining to an opaque section and a light transmission section, and FIG. 1C shows lithography data pertaining to a graytone section;

FIGS. 5A and 5B are fragmentary views for describing a graytone mask, wherein FIG. 5A is a fragmentary plan view and FIG. 5B is a fragmentary cross-sectional view;

FIGS. 6A through 6C are views for describing related-art lithography data, wherein FIG. 6A shows lithography data pertaining to an opaque section and a light transmission section, FIG. 6B shows lithography data pertaining to a graytone section, and FIG. 6C shows merged data obtained when all pattern data are integrated;

DESCRIPTION OF THE PREFERRED EMBODIMENTS

A first embodiment of the invention will be described hereinbelow.

Figure 1A:
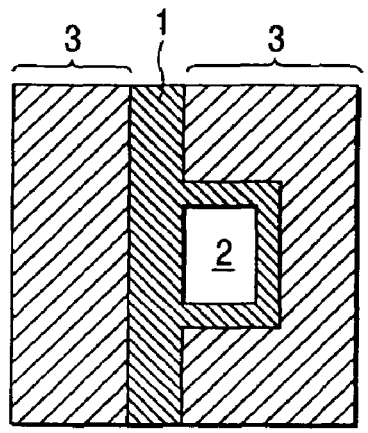
Figure 1B:
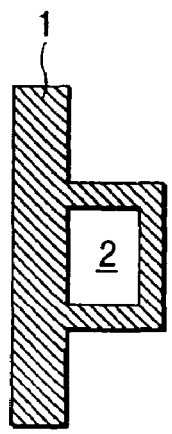
Figure 1C:
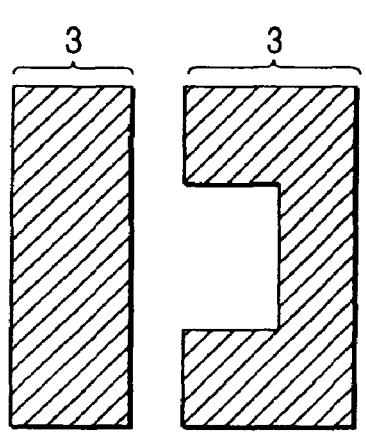

As shown in FIG. 1A, there is taken, as an example, a case where merged data obtained as a result of integration of data pertaining to all patterns to be provided in an opaque section, a light transmission section, and a graytone section are composed of the opaque section 1, the light transmission section 2 (e.g., an amorphous silicon pattern of a TFT), and a graytone section 3 (a semi-transmission or semi-transparent section) formed around the opaque section and the light transmission section. In this case, the data are separated into data pertaining to the opaque section 1 and the light transmission section 2 show in FIG. 1(B) and data pertaining to the graytone section 3 shown in FIG. 1(C). After the light transmission section 2 has been formed by means of lithography at an exposure (of 100%) at which a resist can be removed completely, the graytone section 3 (a semi-transmission or semi-transparent section) can be formed by means of lithography at an exposure which is about one-half the exposure at which a resist is fully sensitized. As a result, there can be performed lithography of a pattern shown in FIG. 1(A). The lithography pattern shown in FIG. 1(A) obviates a necessity of forming, in the graytone section 3, a fine pattern of a size smaller than a resolution limit. When a fine pattern is formed in the graytone section, a problem associated with the volume of data is resolved. No particular limitation is imposed on a sequence in which the light transmission section 2 and the graytone section 3 are to be subjected to lithography, and hence either of the sections can be subjected to lithography first.

Figure 2:
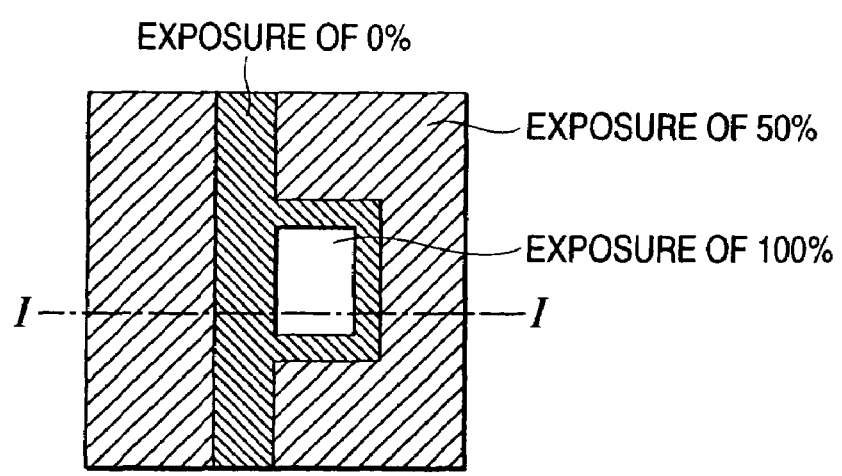
FIG. 2 is a view showing the distribution of dose of radiation after lithography.

FIG. 2 shows the distribution of exposure obtained when the lithography pattern shown in FIG. 1(A) is transferred onto a resist (e.g., an example of a lithography pattern written on a positive resist). More specifically, the exposure required for forming the light transmission section 2 is 100%; the exposure required for forming the graytone section 3 is 50%; and the exposure required for forming the opaque section 1 is 0% (i.e., exposure is not effected).

There will now be described procedures for manufacturing a graytone mask.

FIG. 3 is a fragmentary cross-sectional view showing procedures for manufacturing a graytone mask, showing a cross section taken along line I-I shown in FIG. 2.

Figure 3A:
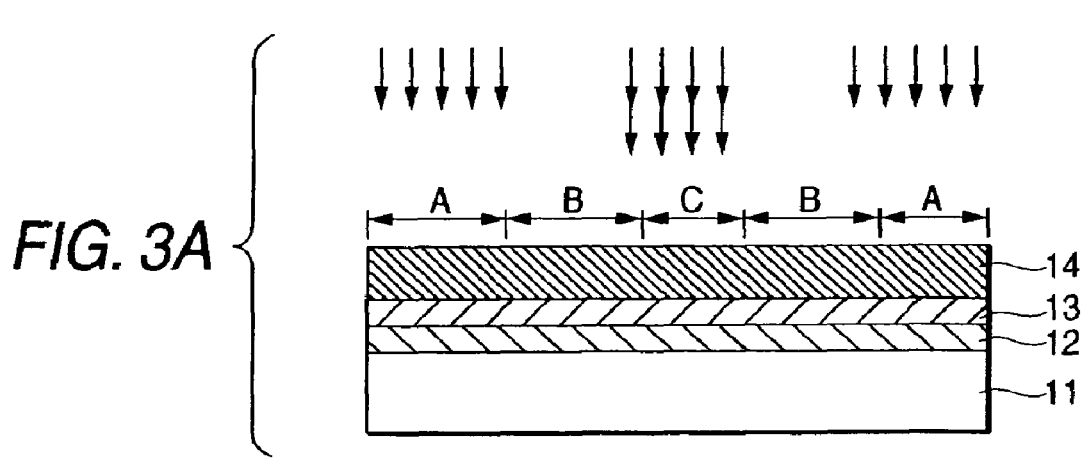
FIGS. 3A through 3F are fragmentary cross-sectional views showing procedures for manufacturing a graytone mask of the embodiment.

As shown in FIG. 3A, a transmissivity controlled film 12, a transmissivity reduced film 13, and a novolak-based positive resist film 14 are sequentially formed on a transparent substrate 11. When the substrate is subjected to lithography at an exposure distribution shown in FIG. 2, the amount of exposing radiation required for lithography is regulated such that an area B becomes unexposed and such that the thickness of an area A after exposure and development becomes about one-half the thickness of a film remaining in the area B. The amount of exposing radiation to which an area C is to be exposed is set to only a level at which no deficiency of radiation arises. According to a lithography method employed at this time, after the area C has been subjected to lithography at an exposure of 100% through use of a laser lithography system, the area A is subjected to lithography at an exposure of about 50%. Either the area A or the area C may be subjected to lithography first.

Figure 3B:
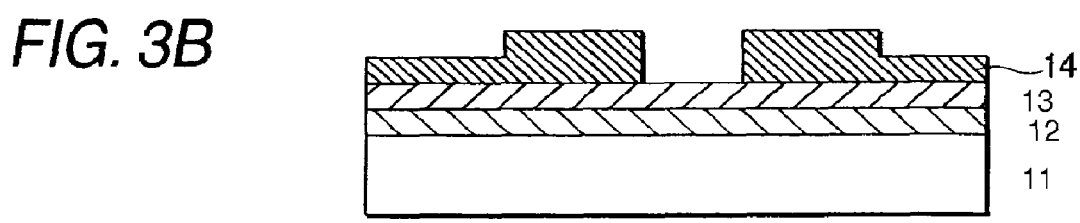

As shown in FIG. 3B, a resist film 14 is processed (i.e., development and film reduction processing), by means of wet processing such that a difference arises in film thickness.

At this time, the thickness of the resist film laid in the area A becomes about one-half that of the resist laid in the area B. The resist film laid in the area C becomes fully removed. Here, wet processing is effected by means of a developing solution of inorganic alkaline (e.g., KOH having a concentration of 0.63N) or that of organic alkaline (e.g., TMAH having a concentration of 2.3%) or such.

Figure 3C:
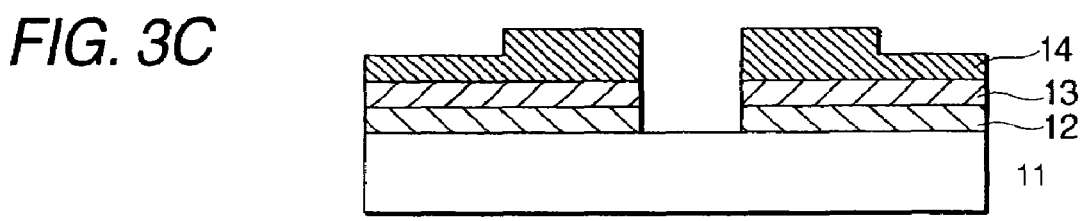

As shown in FIG. 3C, the transmissivity reduced film 13 and the transmissivity controlled film 12, both being exposed in the area C from which the resist has been fully removed, are completely removed by means of wet etching or dry etching.

Figure 3D:
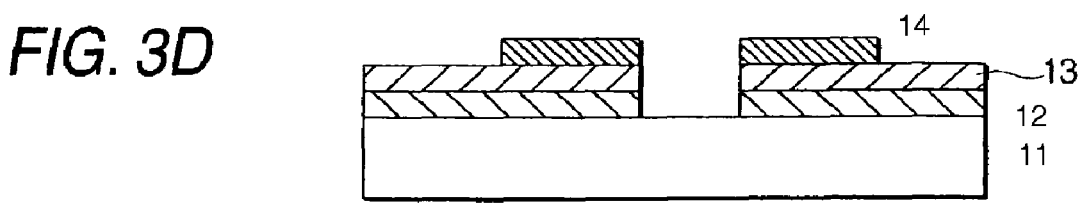

As shown in FIG. 3D, the resist is fully removed from the area A by means of dry processing (e.g., $O_2$ ashing). Consequently, the thickness of the resist located in the area B (i.e., the opaque section) becomes about one-half that obtained originally.

Figure 3E:
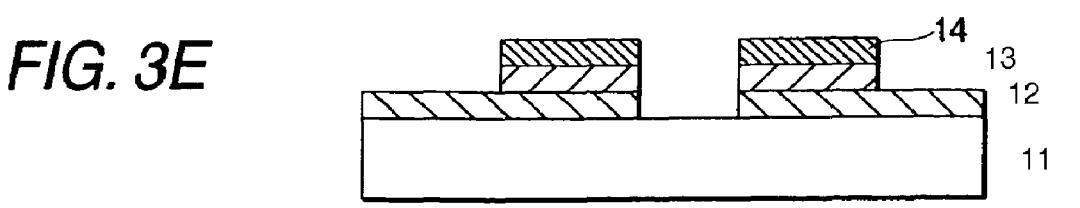

As shown in FIG. 3E, the transmissivity reduced film 13 located in the area A is removed through wet etching or dry etching, thereby forming a graytone section. At this time, etching of the transmissivity controlled film located in the area A can be suppressed by means of selecting material whose etch rate is slower than that of the transmissivity reduced film. Hence, there can be produced a graytone section formed from the transmissivity control section whose transmissivity has been controlled by means of a predetermined thickness.

Figure 3F:
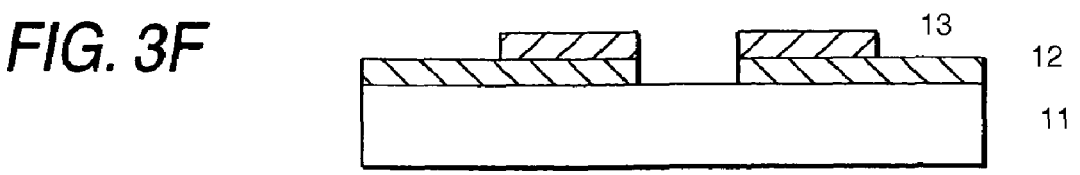

As shown in FIG. 3F, the remaining resist is removed by means of organic alkaline or dry processing ($O_2$ ashing). As a result, there is produced a graytone mask comprising an opaque section formed in the area B, a graytone section formed in the area A, and the light transmission section formed in the area C.

In the embodiment, a mask blank to be used for producing a graytone mask is produced, by means of growing, on a transparent substrate such as a quartz substrate, a transmissivity controlled film from, e.g., CrO, to a thickness at which controlled transmissivity is achieved, by means of sputtering or the like technique; growing, on the transmissivity controlled film, a transmissivity-reduced film from, e.g., Cr, to a thickness at which an opaque characteristic is achieved, by means of sputtering or the like technique; and applying a resist to the transmissivity reduced film to the thickness ranging from 5,000 to 10,000 angstroms.

At this time, an optical density which is to be obtained by a combination of the transmissivity reduced film and the transmissivity controlled film is set to a value of 3.0 or more.

Figure 4:
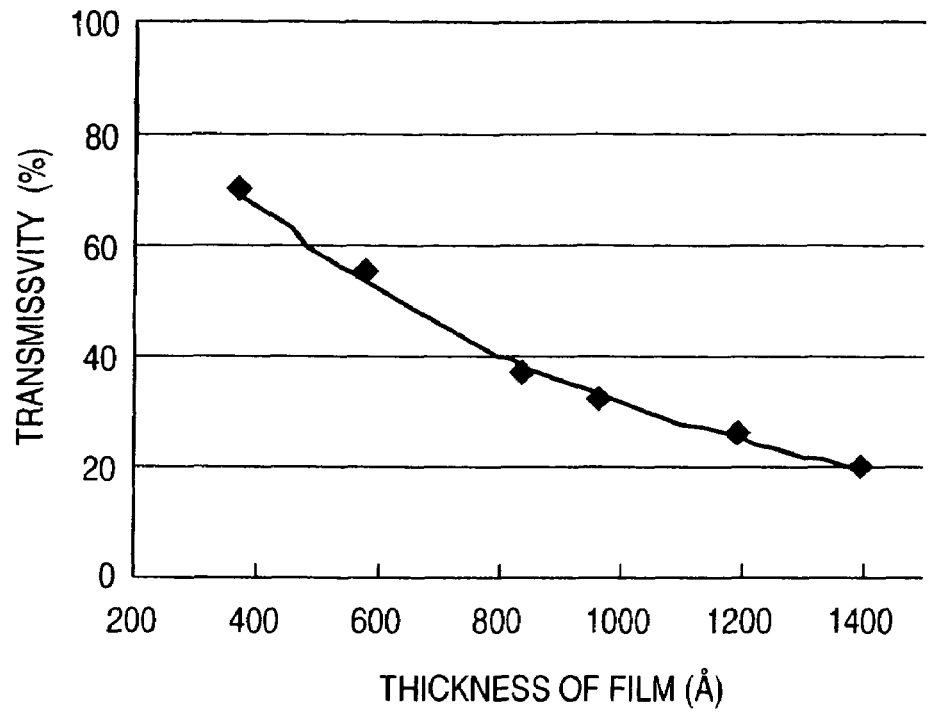
FIG. 4 is a view showing a relationship between the thickness and transmissivity of a CrO transmissivity controlled film.
Figure 5A:
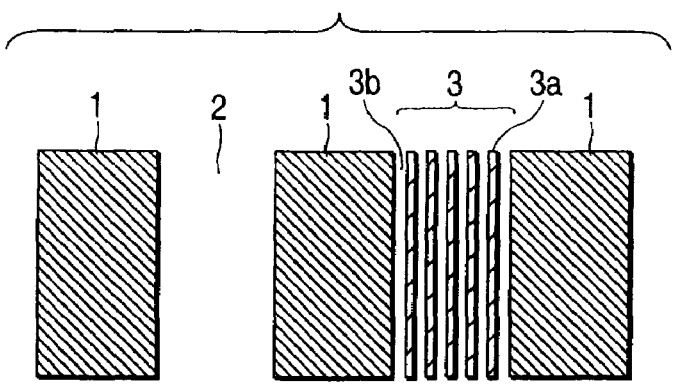
Figure 5B:
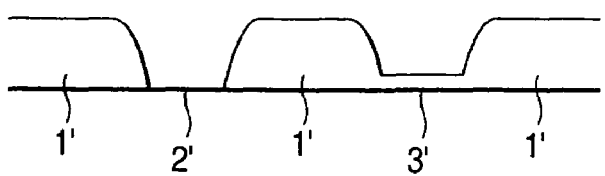

The thickness of the transmissivity controlled film is set to a value at which the transmissivity controlled film gains a transmissivity of 20% to 50%. By way of an example, when CrO is used for producing a transmissivity controlled film, the thickness of the transmissivity controlled film is set so as to fall within a range of 650 to 1400 angstroms (FIG. 4). When Cr is used for producing the transmissivity reduced film, the thickness of the Cr transmissivity reduced film is set to assume a value of 500 angstroms or more.

The thickness of an opaque film formed by lamination of the transmissivity controlled film and the transmissivity reduced film is preferably set to a value of 1,400 to 2,000 angstroms. If the thickness is smaller than a value of 1400 angstroms, the ease of control of a film thickness attained by half etching will become deteriorated. If the thickness is larger than 2000 angstroms, the geometry or accuracy of a pattern will be deteriorated.

There will now be described, as a second embodiment, other procedures for manufacturing a graytone mask.

FIGS. 7A through 8D are fragmentary cross-sectional views showing other procedures for manufacturing a graytone mask, showing cross sections taken along line I-I shown in FIG. 2.

Figure 7A:
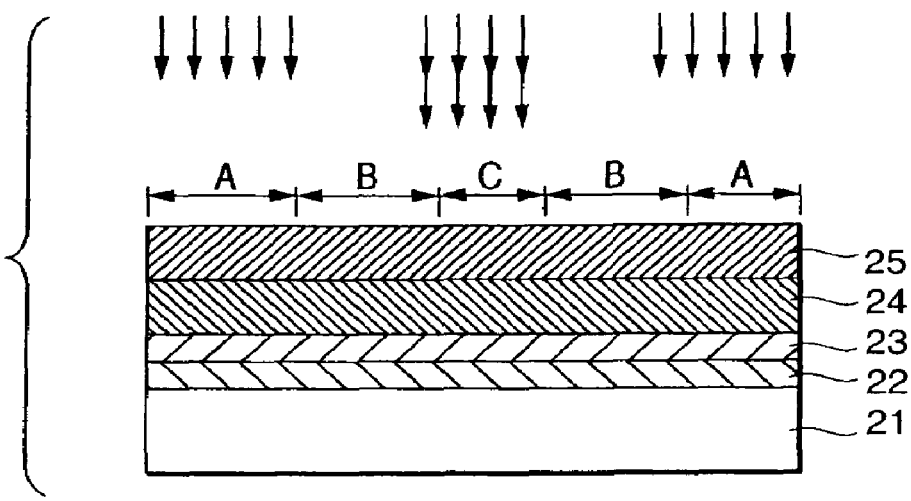
FIGS. 7A through 7D are fragmentary cross-sectional views showing portions of procedures for manufacturing the graytone mask of the embodiment.

As shown in FIG. 7A, sequentially formed on a transparent substrate 21 are a semi-transparent film 22, an etch stopper film (barrier film) 23, an opaque film 24, and a novolak-based positive resist film 25. When the substrate is subjected to lithography with an exposure distribution shown in FIG. 2, the amount of exposing radiation required for lithography is regulated such that an area B becomes unexposed and such that the thickness of an area A becomes about half the thickness of a film remaining in the area B after exposure and development. The amount of exposing radiation to which an area C is to be exposed is set to only a level at which no deficiency arises in the exposure to be used for patterning a resist (i.e., a residual film becomes zero). According to a lithography method employed at this time, after the area C has been subjected to lithography at an exposure of 100% by means of a laser lithography system, the area A is subjected to lithography at an about 50% exposure. Either the area A or the area C may be subjected to lithography first.

Figure 7B:
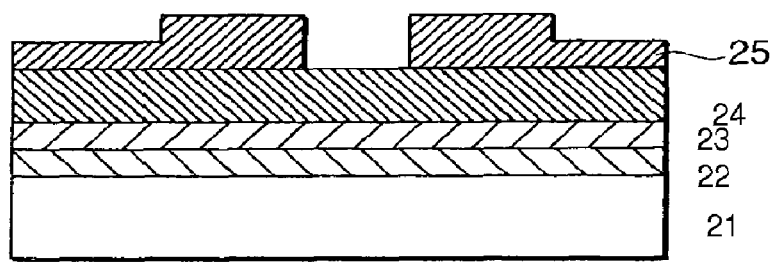

As shown in FIG. 7B, a resist film 25 is processed (i.e., development and film reduction processing), by means of wet processing such that a difference in film thickness arises.

At this time, the thickness of the resist film 25 laid in the area A becomes about one-half that of the resist laid in the area B. The resist film laid in the area C becomes fully removed. Here, wet processing is effected by means of a developing solution of inorganic alkaline (e.g., KOH having a concentration of 0.63N) or that of organic alkaline (e.g., TMAH having a concentration of 2.3%) or such.

Figure 7C:
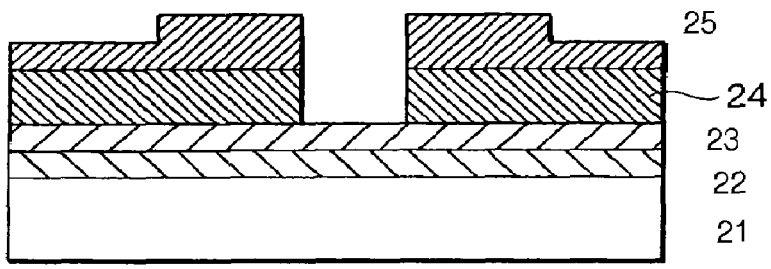

As shown in FIG. 7C, the opaque film 24 exposed in the area C—from which the resist has been fully removed—is completely removed by means of wet etching or dry etching.

Figure 7D:
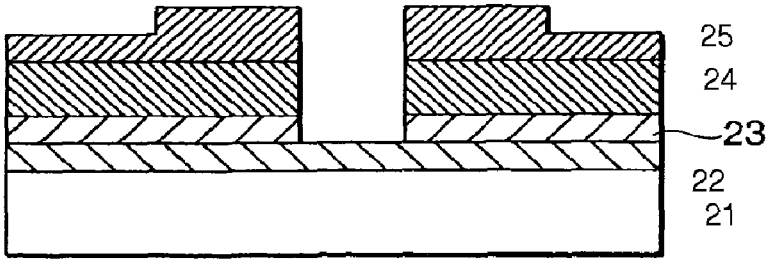

As shown in FIG. 7D, the etch stopper film (a $SiO_2$ film or SOG) 23 situated in the area C is removed by means of wet etching using a fluorine-based solution or dry etching using a fluorine-based gas.

When the etch stopper film 23 is processed by means of dry etching, removal of a resist from the area A (semi-transparent section) to be performed in the next step (FIG. 8A) may be performed simultaneously.

Figure 8A:
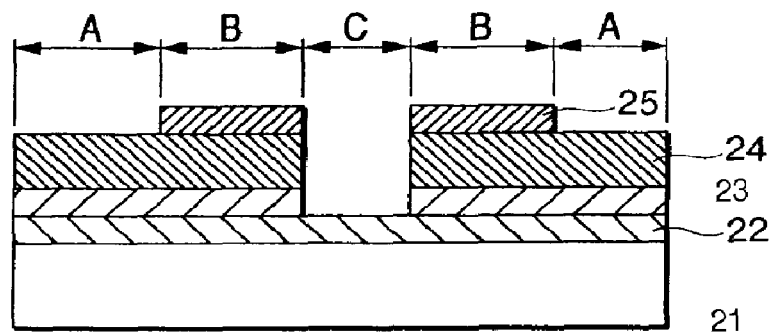
FIGS. 8A through 8D are fragmentary cross-sectional views showing portions of procedures for manufacturing the graytone mask of the embodiment.

As shown in FIG. 8A, the resist is fully removed from the area A by means of dry processing (e.g., $O_2$ ashing). Consequently, the thickness of the resist film 25 located in the area B (i.e., the opaque section) becomes about one-half that obtained originally.

When the etch stopper film 23 is processed through dry etching in a preceding step (FIG. 7D), this step may be omitted.

Figure 8B:
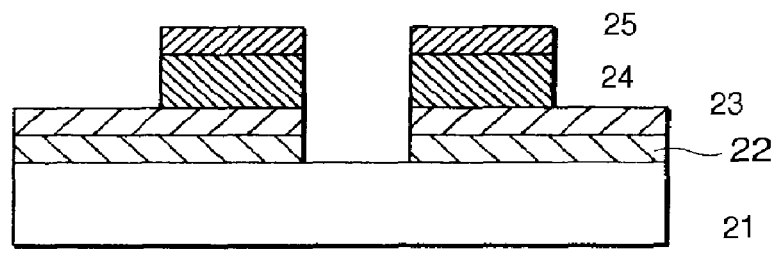

As shown in FIG. 8B, the opaque film 24 located in the area A and the semi-transparent film 22 located in the area C are removed by means of dry or wet etching, thereby producing a light transmission section and a semi-transparent section simultaneously. At this time, the semi-transparent film 22 located in the area A is protected by the etch stopper film, and hence the film 22 is not etched.

Figure 8C:
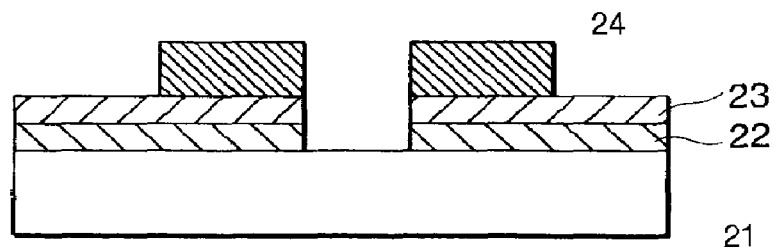

As shown in FIG. 8C, the remaining resist is removed by means of organic alkaline or dry processing ($O_2$ ashing). As a result, there is produced a graytone mask comprising an opaque section formed in the area B, a graytone section formed in the area A, and the light transmission section formed in the area C.

Figure 8D:
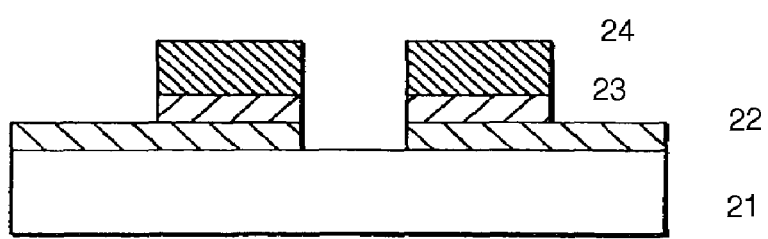

When the etch stopper film 23 located in the semi-transparent section is removed, the etch stopper film can be removed from the area A (semi-transparent section) by means of, e.g., wet etching or dry etching (FIG. 8D).

In the second embodiment, a mask blank to be used for producing a graytone mask is produced, by means of growing, on a transparent substrate such as a quartz substrate, a semi-transparent film from, e.g., Cr or a chromium compound (e.g., CrO), to a thickness at which controlled transmissivity is achieved, by means of sputtering or the like technique; growing, on the semi-transparent film, an etch stopper layer (barrier layer) from, e.g., a $SiO_2$ film (formed by sputtering or vapor deposition), or by means of the spin-on-glass (SOG) technique to a thickness at which an opaque characteristic is achieved; growing, on the etch stopper layer, an opaque film from, e.g., Cr, to a thickness at which an opaque characteristic is to be achieved, by means of sputtering; and applying a resist on the opaque film to a thickness ranging from 5,000 to 10,000 angstroms.

So long as the opaque film and the semi-transparent film are formed from Cr-based material and an etch stopper film is formed from $SiO_2$-based material, the Cr-based material can be etched away by means of wet etching employing a solution, the solution being composed by application of perchloric acid to cerium nitrite ammonium, or by means of dry etching using chlorine-based gas. Further, the $SiO_2$-based material can be etched away by means of wet etching using a fluorine-based solution or dry etching using fluorine-based gas. The Cr-based material has a high etch selectivity against the etchant or etching gas used for etching the $SiO_2$-based material, whilst the $SiO_2$-based material has a high etch selectivity against the etchant or etching as used for etching the Cr-based material. Therefore, the Cr-based material is less susceptible to etching during etching of the $SiO_2$-based material, and the $SiO_2$-based material is less susceptible to etching during etching of the Cr-based material.

Since the $SiO_2$ film or the etch stopper film consisting of SOG does not exert any influence on transmissivity, it may be left unremoved.

At this time, an optical density to be achieved by combination of the opaque film and the semi-transparent film is set to a value of 3.0 or more.

Further, the thickness of the etch stopper film is set to a range of 100 to 1000 angstroms.

Figure 9:
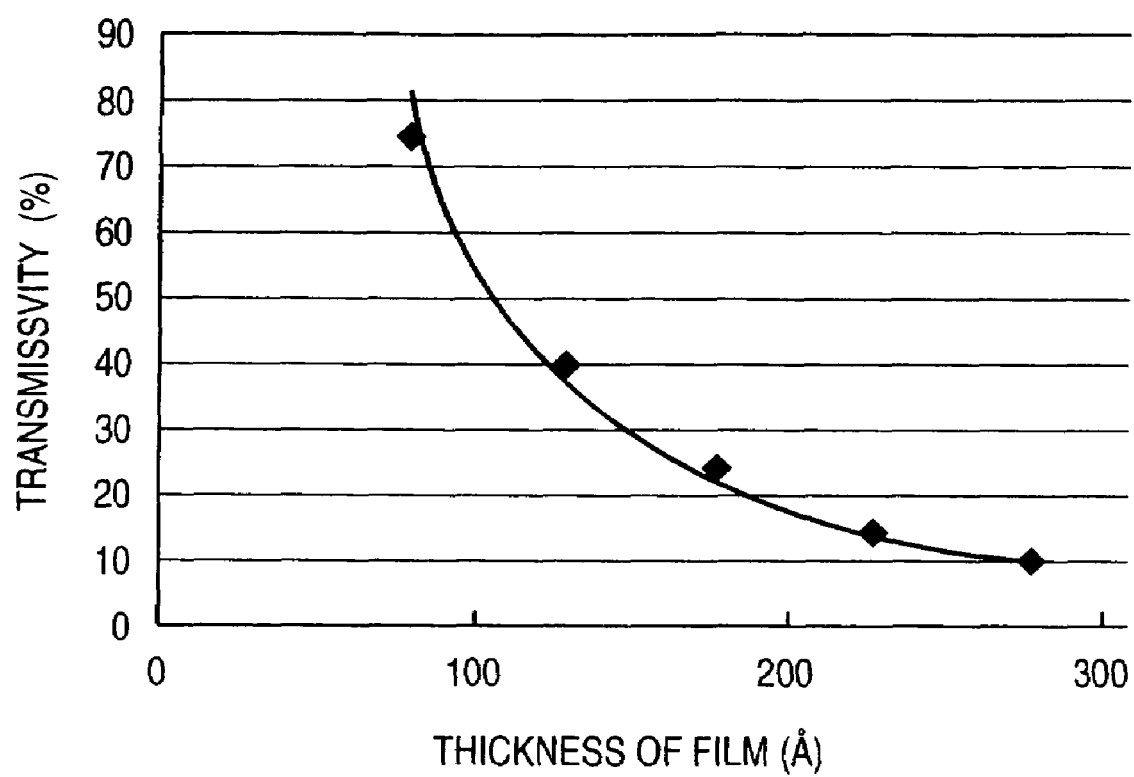
FIG. 9 is a view showing a relationship between the thickness and transmissivity of a Crsemi-transparent film.

The thickness of a semi-transparent film is set to a value at which the transmissivity of the semi-transparent film assumes a value of 20 to 50%. By way of an example, when Cr is used for producing a semi-transparent film, the thickness of the semi-transparent film is set so as to fall within a range of 100 to 200 angstroms (FIG. 9), and when CrO is used for producing a semi-transparent film, the thickness of the semi-transparent film is set so as to fall within a range of 650 to 1400 angstroms (FIG. 4).

The invention is not limited to the above-described embodiments.

For example, in the stage of a mask blank, an anti-reflection layer may be provided on the transmissivity reduced film. In this case, the transmissivity reduced film and the anti-reflection film can be etched simultaneously, and hence an increase in the number of processes does not arise. The anti-reflection layer can be formed from, e.g., chromium oxide ($CrO_x$), chromium nitride ($CrN_x$), or chromium oxinitride ($CrO_xN_y$) or such.

The same can also be applied to a case where an opaque film is employed in place of the transmissivity reduced film and an anti-reflection film is formed on the opaque film.

Here, dry etching or dry processing can be performed in place of the wet processing, and wet processing can be performed in place of the dry etching or dry processing. Further, the laser lithography system is not limited to an aligner, but another exposure system may also be employed.

The amount of exposing radiation to which the graytone section (semi-transparent section) is to be exposed is not limited to 50% of the dose required for sufficiently sensitizing a photoresist of predetermined thickness.

As has been described, according to the invention, there can be obtained a graytone mask which is formed from a transmissivity controlled film or a like film and has high evenness in the thickness of the graytone section. Alternatively, a transmissivity reduced film can be formed from a thin film having a high opaque characteristic, such as a chromium film. Hence, there can be made an attempt to shorten a time and reduce an aspect ratio, as a result of which the geometry and accuracy of a pattern formed in the opaque section are improved.

The invention is indispensable particularly for commercializing a large graytone mask for use in manufacturing an LCD.

What is claimed is:

1. A graytone mask having an opaque section, a light transmission section, and a graytone section, wherein said graytone section permits transmission of a portion of an exposure light so that an area of photoresist film exposed with the graytone mask, corresponding to the graytone section, upon development, remains with a thickness different from an area corresponding to the opaque section or the light transmission section, said mask comprising:
   a transparent substrate;
   a semi-transparent film having a transmissivity of 20 to 50% of the exposure light; and
   an opaque film which substantially reduces the transmission of the exposure light,
   wherein the semi-transparent film comprises a different material than the opaque film,
   wherein the opaque section of the mask comprises the semi-transparent film and the opaque film formed on the substrate,
   wherein the graytone section of the mask comprises the semi-transparent film formed on the substrate.

2. The graytone mask of claim 1, wherein the opaque film is layered directly on the semi-transparent film.

3. The graytone mask of claim 1 wherein both of the semi-transparent film and the opaque film include chromium.

4. The graytone mask of claim 3, wherein an etching rate for the semi-transparent film is equal to or slower than that of the opaque film.

5. The graytone mask of claim 1, wherein the semi-transparent film comprises a material selected from a group consisting of $CrO_x$, $CrN_x$, $CrO_xN_y$, and $CrF_x$.

6. The graytone mask of claim 1, wherein the opaque film comprises a material selected from a group consisting of Cr, Si, W, and Al.

7. The graytone mask of claim 1, wherein the semi-transparent film comprises a material selected from a group consisting of MoSi, Si, W, and Al.

8. The graytone mask of claim 1, wherein an antireflective film is disposed on the opaque film.

9. The graytone mask of claim 1, wherein the mask comprises a pattern which includes the opaque section and the light-transmission section being adjacent with each other.

10. The graytone mask of claim 1, wherein the semi-transparent film and the opaque film layered on the substrate form a thickness of 1400 to 2000 Å.

11. A graytone mask blank for use in manufacturing the graytone mask, said graytone mask having an opaque section, a light transmission section, and a graytone section, wherein said graytone section permits transmission of a portion of an exposure light so that an area of photoresist film exposed with the graytone mask, corresponding to the graytone section, upon development, remains with a thickness different from an area corresponding to the opaque section or the light transmission section, said graytone mask blank comprising:
   a transparent substrate;
   a semi-transparent film which controls the transmission of the exposure light; and
   an opaque film which substantially reduces the transmission of the exposure light,
   wherein the semi-transparent film comprises a different material from the opaque film and has a light transmissivity of 20 to 50%.

12. The graytone mask blank of claim 11, wherein the opaque film is disposed on the semi-transparent film.

13. The graytone mask blank of claim 11, wherein both of the semi-transparent film and the opaque film include chromium.

14. The graytone mask blank of claim 13, wherein the etching rate for the semi-transparent film is equal to or slower than that of the opaque film.

15. The graytone mask blank of claim 11, wherein the semi-transparent film comprises a material selected from a group consisting of $CrO_x$, $CrN_x$, $CrO_xN_y$, and $CrF_x$.

16. The graytone mask blank of claim 11, wherein the opaque film comprises a material selected from a group consisting of Cr, Si, W, and Al.

17. The graytone mask blank of claim 11, wherein the semi-transparent film comprises a material selected from a group consisting of MoSi, Si, W, and Al.

18. The graytone mask blank of claim 11, wherein the semi-transparent film comprises MoSi.

19. The graytone mask blank of claim 11, wherein a total thickness of the semi-transparent film and the opaque film is 1400 to 2000 Å.

20. A graytone mask having an opaque section, a light transmission section, and a graytone section, wherein said graytone section permits transmission of a portion of an exposure light so that an area of photoresist film exposed with the graytone mask, corresponding to the graytone section, upon development, remains with a thickness different from an area corresponding to the opaque section or the light transmission section, said mask comprising:
   a transparent substrate;
   a semi-transparent film which controls the transmission of the exposure light;
   an opaque film which substantially reduces the transmission of the exposure light; and
   an etching stopper film,
   wherein the semi-transparent film comprises a different material than the opaque film,
   wherein the opaque section of the mask comprises the semi-transparent film, the opaque film and the etching stopper film formed on the substrate, said etching stopper film being between the semi-transparent film and the opaque film,
   wherein the graytone section of the mask comprises the semi-transparent film.

21. The graytone mask of claim 20, wherein the graytone section further comprises the etching stopper film.

22. The graytone mask of claim 20, wherein the semi-transparent film and the opaque film are capable of being etched by a single liquid etching agent or a single etching gas.

23. The graytone mask of claim 20, wherein the etching stopper film comprises $SiO_2$ or spin on glass (SOG).

24. The graytone mask according to claim 20, wherein the graytone mask is an LCD mask or PDP mask.

25. A graytone mask blank for use in manufacturing a graytone mask, said graytone mask having an opaque section, a light transmission section, and a graytone section, wherein said graytone section permits transmission of a portion of an exposure light so that an area of photoresist film exposed with the graytone mask, corresponding to the graytone section, upon development, remains with a thickness different from an area corresponding to the opaque section or the light transmission section, said graytone mask blank; comprising:
   a transparent substrate;

a semi-transparent film which controls the transmission of the exposure light;

an opaque film which substantially reduces the transmission of the exposure light; and an etching stopper film formed between the semi-transparent film and the opaque film, wherein the semi-transparent film comprises a different material than a material of the opaque film and has a light transmissivity of 20 to 50%.

26. The graytone mask blank of claim 25, wherein both of the semi-transparent film and the opaque film comprise chromium.

27. The graytone mask of claim 25, wherein the semi-transparent film comprises a chromium compound and the opaque film comprises chromium.

28. The graytone mask blank of claim 25, wherein the semi-transparent film comprises a material selected from a group consisting of $CrO_x$, $CrN_x$, $CrO_xN_y$, and $CrF_x$.

29. The graytone mask blank of claim 25, wherein the semi-transparent film comprises a material selected from a group consisting of MoSi, Si, W, and Al.

30. The graytone mask blank of claim 25, wherein the opaque film comprises a material selected from a group consisting of Cr, Si, W, and Al.

31. The graytone mask blank of claim 25, wherein the thickness of the etching stopper film is 100 to 1000 Å.

32. The graytone mask blank of claim 25, wherein the semi-transparent film and the opaque film are capable of being etched by a same liquid etching agent or a same etching gas.

33. The graytone mask blank of claim 25, wherein the etching stopper film comprises $SiO_2$ or spin on glass (SOG).

34. The graytone mask of claim 1, wherein the light transmission section consists of the transparent substrate.

35. The graytone mask blank of claim 11, wherein the light transmission section consists of the transparent substrate.

36. The graytone mask of claim 20, wherein the light transmission section consists of the transparent substrate.

37. The graytone mask of claim 25, wherein the light transmission section consists of the transparent substrate.

* * * * *